United States Patent
Wong et al.

(10) Patent No.: US 11,686,771 B2
(45) Date of Patent: Jun. 27, 2023

(54) CHIP, CHIP TESTING METHOD AND ELECTRONIC DEVICE

(71) Applicant: CHENGDU HAIGUANG INTEGRATED CIRCUIT DESIGN CO., LTD., Sichuan (CN)

(72) Inventors: Yuqian Cedric Wong, Austin, TX (US); Shuiyin Yao, Beijing (CN); Hongchang Liang, Austin, TX (US); Zhimin Tang, Beijing (CN)

(73) Assignee: CHENGDU HAIGUANG INTEGRATED CIRCUIT DESIGN CO., LTD., Sichuan (CN)

( * ) Notice: Subject to any disclaimer, the term of this patent is extended or adjusted under 35 U.S.C. 154(b) by 292 days.

(21) Appl. No.: 17/254,246

(22) PCT Filed: Dec. 30, 2019

(86) PCT No.: PCT/CN2019/129935
§ 371 (c)(1),
(2) Date: Dec. 18, 2020

(87) PCT Pub. No.: WO2021/134220
PCT Pub. Date: Jul. 8, 2021

(65) Prior Publication Data
US 2022/0221513 A1 Jul. 14, 2022

(51) Int. Cl.
*G01R 31/3185* (2006.01)
*G01R 31/317* (2006.01)
*G01R 31/3177* (2006.01)

(52) U.S. Cl.
CPC . *G01R 31/318536* (2013.01); *G01R 31/3177* (2013.01); *G01R 31/31723* (2013.01);
(Continued)

(58) Field of Classification Search
CPC ...... G01R 31/318536; G01R 31/31723; G01R 31/3177; G01R 31/318544; G01R 31/318583
(Continued)

(56) References Cited

U.S. PATENT DOCUMENTS 7,895,491 B2 * 2/2011 Wong ............. G01R 31/318575
714/733
9,835,683 B2 * 12/2017 Khandelwal ... G01R 31/318552
(Continued)

FOREIGN PATENT DOCUMENTS

| CN | 101975922 A | 2/2011 |
| CN | 102062836 A | 5/2011 |

(Continued)

OTHER PUBLICATIONS

Bhunia et al., Low-Power Scan Design Using First-Level Supply Gating, Mar. 2005, IEEE, vol. 13, No. 3, pp. 384-395. (Year: 2005).*
(Continued)

*Primary Examiner* — John J Tabone, Jr.
(74) *Attorney, Agent, or Firm* — Loeb & Loeb LLP (57) ABSTRACT

A chip, a chip testing method and an electronic device are provided. The chip includes a combinational logic and a data path gating; the data path gating includes a first input terminal and an output terminal, the first input terminal of the data path gating detects a test enable signal, and the output terminal of the data path gating is connected to the combinational logic; the test enable signal is used to switch a test mode of the chip; the data path gating is configured to output a data path gating control signal to the combinational logic, in a case where the detected test enable signal indicates that a current test mode is irrelevant to a data path function of the combinational logic; and the combinational
(Continued)

logic is configured to disable the data path function after receiving the data path gating control signal, to disable data path toggling.

20 Claims, 8 Drawing Sheets

(52) U.S. Cl.
CPC ............. *G01R 31/318544* (2013.01); *G01R 31/318583* (2013.01)

(58) Field of Classification Search
USPC .............................. 714/726, 729, 727, 735
See application file for complete search history.

(56) References Cited

U.S. PATENT DOCUMENTS

| | | | |
|---|---|---|---|
| 9,897,653 B2 | 2/2018 | Fel | |
| 10,598,728 B2 | 3/2020 | Fel | |
| 2002/0078411 A1* | 6/2002 | D'Abreu | G01R 31/318555 714/727 |
| 2007/0260954 A1* | 11/2007 | Wong | G01R 31/318575 714/733 |
| 2012/0062283 A1* | 3/2012 | Kwan | G01R 31/318575 327/143 |
| 2014/0331099 A1* | 11/2014 | Wong | G01R 31/318547 714/733 |
| 2015/0067423 A1* | 3/2015 | GopalaKrishnaSetty | G01R 31/318544 714/726 |
| 2022/0221513 A1* | 7/2022 | Wong | G01R 31/3177 |

FOREIGN PATENT DOCUMENTS

| | | |
|---|---|---|
| CN | 103076559 A | 5/2013 |
| CN | 109375094 A | 2/2019 |
| CN | 109656350 A | 4/2019 |
| JP | 2013061229 A | 4/2013 |

OTHER PUBLICATIONS

Lin et al., Test Power Reduction by Blocking Scan Cell Outputs, 2008, IEEE, pp. 329-336 (Year: 2008).*
Mojtabavi et al., A Novel Scan Architecture for Low Power Scan-Based Testing, Mar. 26, 2015, VLSI Design, vol. 2015, Article ID 264071, pp. 1-13. (Year: 2015).*
English Translation of the China Written Opinion for PCT/CN2019/129935, dated Sep. 29, 2020. . (Year: 2020).*
China National Intellectual Property Administration, International Search Report and Written Opinion, dated Sep. 29, 2020, 12 pages.

\* cited by examiner

| shift mode | capture mode |
|---|---|
| scan shift operation | capture response |

CHIP, CHIP TESTING METHOD AND ELECTRONIC DEVICE

CROSS-REFERENCE TO RELATED APPLICATION

This application is an US National Phase application claiming priority to the PCT International Application PCT/CN2019/129935, filed on Dec. 30, 2019. For all purposes, the entire disclosure of the aforementioned application is incorporated by reference as part of the disclosure of this application.

TECHNICAL FIELD

Embodiments of the present disclosure relate to a chip, a chip testing method and an electronic device.

BACKGROUND

Chip testing is an indispensable step in producing a chip product, and chip testing is usually implemented based on DFT (design for test). DFT refers to that, in order to make chip testing as reliable as possible, some additional logics are added when the chip is designed while the designed functions of the chip are not changed.

SUMMARY

At least one embodiment of the present disclosure provides a chip, which includes a combinational logic and a data path gating, wherein the data path gating comprises a first input terminal and an output terminal, the first input terminal of the data path gating detects a test enable signal, and the output terminal of the data path gating is connected to the combinational logic; the test enable signal is used to switch a test mode of the chip;

the data path gating is configured to output a data path gating control signal to the combinational logic, in a case where the detected test enable signal indicates that a current test mode is irrelevant to a data path function of the combinational logic; and the combinational logic is configured to disable the data path function after receiving the data path gating control signal, to disable data path toggling.

In at least one embodiment, the chip further includes a first scan chain, wherein the first scan chain is connected with the first input terminal of the data path gating and is connected with the combinational logic;

the first scan chain comprises a plurality of triggers which are connected in order; and each of the plurality of triggers at least comprises a scan input port and a scan output port; and a scan input port of a first trigger of the first scan chain is used as a scan input port of the scan chain, and a scan output port of a last trigger of the first scan chain is used as a scan output port of the scan chain.

In at least one embodiment, in the first scan chain, a scan output port of a preceding trigger is connected to a scan input port of a following trigger.

In at least one embodiment, each of the plurality of triggers further comprises: a data input port and a data output port, a data input port of each of the plurality of triggers of the first scan chain is used as a data input port to be connected with the combinational logic to receive an output of the combinational logic; and a data output port of each of the plurality of triggers of the first scan chain is used as a data output port to be connected with the combinational logic to output data to the combinational logic.

In at least one embodiment, each of the plurality of triggers further comprises a clock port, and the clock port is configured to receive a clock signal.

In at least one embodiment, the first input terminal of the data path gating detects the test enable signal through an enable connection line of the first scan chain which is in a functional mode.

In at least one embodiment, the test enable signal comprises a scan enable signal in a scan test of the chip, and the scan enable signal is configured to switch a shift mode and a capture mode of the chip.

In at least one embodiment, each of the plurality of triggers further comprises a scan enable port, wherein the scan enable port is configured to receive the scan enable signal.

In at least one embodiment, the scan enable port of each of the plurality of triggers is connected to the first input terminal of the data path gating.

In at least one embodiment, the data path gating is further configured to:

output a data path gating control signal to the combinational logic in a case where the detected scan enable signal indicates the shift mode.

In at least one embodiment, the first scan chain is so configured that: in the shift mode, the first scan chain serially shifts a shift test pattern into each of the plurality of triggers of the first scan chain through the scan input terminal of the first scan chain and outputs a shift test output value at the scan output terminal of the first scan chain; in a case where the plurality of triggers of the first scan chain are determined to have no defects by comparing the shift test pattern and the shift test output value, the scan input port of the first scan chain obtains incentive data to configure initial values of the data output ports of the plurality of triggers of the first scan chain.

In at least one embodiment, the data path gating is further configured to control the combinational logic to enable data path toggling, in a case where the detected scan enable signal indicates the capture mode.

In at least one embodiment, the combinational logic is further configured to, in the capture mode, obtain a capture test pattern and to output to the first scan chain a response value corresponding to the capture test pattern.

In at least one embodiment, the first scan chain is further configured to latch the response value by the data output port of each of the plurality of triggers of the first scan chain.

In at least one embodiment, the scan enable signal indicates the shift mode in a case where the scan enable signal is a first level signal; the scan enable signal indicates the capture mode in a case where the scan enable signal is a second level signal; and a level of the first level signal is higher than a level of the second level signal.

In at least one embodiment, the scan enable signal is the first level signal in a case where a value of the scan enable signal is 1; and the scan enable signal is the second level signal in a case where a value of the scan enable signal is 0.

In at least one embodiment, the chip further includes: a central processing unit, wherein the central processing unit comprises a data pin; the data pin of the central processing unit is connected to the combinational logic.

In at least one embodiment, the chip further includes: a second scan chain, wherein the combinational logic is connected between the first scan chain and the second scan chain.

In at least one embodiment, the second scan chain comprises a plurality of trigger which are connected in order, and each of the plurality of triggers of the second scan chain comprises a data input port; and the combinational logic is connected to a data input port of a first trigger of the second scan chain.

In at least one embodiment, each of the plurality of triggers of the second scan chain comprises a scan input port, and the scan output port of the first scan chain is connected to the scan input port of the first trigger of the second scan chain.

At least one embodiment of the present disclosure further provides a chip testing method, the chip testing method being adapted for a data path gating, a first input terminal of the data path gating being configured to detect a test enable signal, an output terminal of the data path gating being connected to a combinational logic, and the chip testing method including:

detecting a test enable signal, wherein the test enable signal is configured to switch a test mode of the chip; and outputting a data path gating control signal to the combinational logic in a case where the detected test enable signal indicates that a current test pattern is irrelevant to a data path function of the combinational logic, so as to disable a data path function of the combinational logic so that the combinational logic disables data path toggling.

In at least one embodiment, the test enable signal comprises a scan enable signal in a scan test of the chip, wherein the scan enable signal is configured to switch a shift mode and a capture mode of the chip;

the first input terminal of the data path gating is connected to a scan enable port of a scan chain, and the scan enable port of the scan chain is used to receive the scan enable signal;

the detecting the test enable signal comprises:

detecting the scan enable signal inputted to the scan enable port of the scan chain; and the outputting the data path gating control signal to the combinational logic in the case where the detected test enable signal indicates that the current test pattern is irrelevant to the data path function of the combinational logic comprises:

outputting the data path gating control signal to the combinational logic in a case where the detected scan enable signal indicates the shift mode.

In at least one embodiment, the chip testing method further comprises:

controlling the combinational logic to enable data path toggling in a case where the detected scan enable signal indicates the capture mode.

In at least one embodiment, the scan enable signal indicates the shift mode in a case where the scan enable signal is a first level signal; the scan enable signal indicates the capture mode in a case where the scan enable signal is a second level signal; and a level of the first level signal is higher than a level of the second level signal.

At least one embodiment of the present disclosure further provides an electronic device, comprising any one of the above-mentioned chip.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the invention and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just part of but not all of the embodiments of the present disclosure. Based on the described embodiments herein, those skilled in the art can obtain other embodiment(s), without any inventive work, which should be within the scope of the present disclosure.

Based on DFT, modes of a chip are generally classified into a test mode and a functional mode; the circuit activity of the chip is generally higher in the test mode than in the functional mode, and thus the power consumption of the chip is generally higher in the test mode than in the functional mode; the higher power consumption of the test mode undoubtedly increases the costs of chip testing and reduces the reliability of the chip, and thus how to further reduce the power consumption of the chip in the test mode (i.e., reducing the testing power consumption of the chip) without affecting the speed performance of the chip in the functional mode has always become a research topic to the technician the industry.

Studies of the inventors of the present disclosure found: test modes of a chip may be classified into numerous types, and when the test mode of the chip is irrelevant to a data path function of a combinational logic, the data path function of the combinational logic may be disabled so that the combinational logic disables data path toggling to prevent this combinational logic from being controlled by other combinational logics, thereby reducing the testing power consumption of the chip and meanwhile ensuring the speed performance of the chip in the functional mode.

In view of the above, inventors of the present disclosure provide a novel chip structure and a corresponding testing method to reduce the testing power consumption of the chip. In the following, the technical solutions in the embodiments of the present disclosure will be clearly and completely described with reference to the drawings in the embodiments of the present disclosure. It is apparent that the described embodiments are only a part of the embodiments of the present disclosure, but not all the embodiments. All other embodiments obtained by a person of ordinary skills in the art without any creative work based on the embodiments of the present disclosure are intended to be within the scope of the present disclosure.

Figure 1:
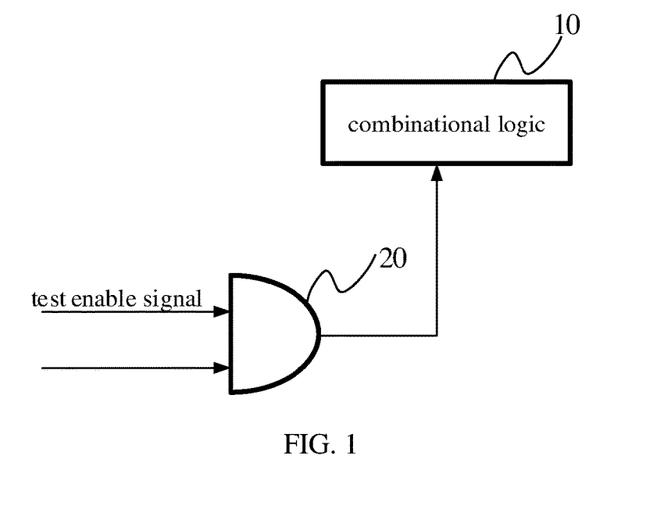
FIG. 1 is a schematic structural diagram of a chip provided by at least one embodiment of the present disclosure.

FIG. 1 is a schematic diagram of an optional structure of a chip provided by at least one embodiment of the present disclosure. As shown in FIG. 1, the chip may include: a combinational logic 10, and a data path gating 20 attached to the chip; an output terminal of the data path gating 20 may be connected with the combinational logic 10, a first input terminal of the data path gating 20 may be used to detect a test enable signal, and the test enable signal may be used to switch a test mode of the chip.

Optionally, the data path gating 20 may include at least two input terminals, the first input terminal may be one of the at least two input terminals, and a remaining input terminal thereof may be used to connect other functional components (such as other combinational logic) of the chip.

Optionally, the combinational logic 10 is a circuit for which the output state of the chip at any time is only determined by the input state(s) at this time, and the characteristics of the combinational logic in the aspect of logic function involve that the output at any time is only determined by the input(s) at that time and is irrelevant to the original state of the combinational logic. As an example, the combinational logic may be any one of an arithmetical operation circuit (e.g., an adder, a multiplier, etc.), an encoder, a decoder, a data selector, a data distributor, and a digital comparator in the chip.

In at least one embodiment of the present disclosure, if a current test mode indicated by the test enable signal which is detected by the data path gating 20 is irrelevant to the data path function of the combinational logic, the output terminal of the data path gating 20 may output a data path gating control signal to disable the data path function of the combinational logic so that the combinational logic disables data path toggling and prevents this combinational logic from being controlled by other combinational logics; therefore, in the case where the current test mode is irrelevant to the data path function of the combinational logic, the combinational logic may disable data path toggling to realize the reduction of the test power consumption of the chip and to make it possible to reduce the costs of chip testing and improve the reliability of the chip while the speed performance of the chip in a functional mode is ensured.

In an optional implementation, the test enable signal may be a scan enable signal for the chip in a scan test, which is used to switch a shift mode and a capture mode of the scan test; in another optional implementation, the test enable signal may be any signal for chip testing, and the embodiments of the present disclosure have no limitation in this aspect.

As an optional implementation of the contents disclosed by the embodiments of the present disclosure, the scenario of reducing the testing power consumption of the chip in the scan test is taken as an example to illustrate the solution of reducing testing power consumption of the chip provided by the embodiments of the present disclosure.

A scan test is a common chip testing method implemented based on DFT, and is an important test item in numerous chip testing fields (in particular, the field of chip testing of a system on chip); the scan test replaces the triggers in the chip with triggers having a scanning ability and connects the triggers in series to form a scan chain from an input to an output so as to test the triggers and the combinational logic connected with the triggers in the chip by using the scan chain.

For example, the chip structure of at least one embodiment of the present disclosure may include a first scan chain. The first scan chain is connected with a first input terminal of the data path gating and is connected with the combinational logic.

Figure 2:
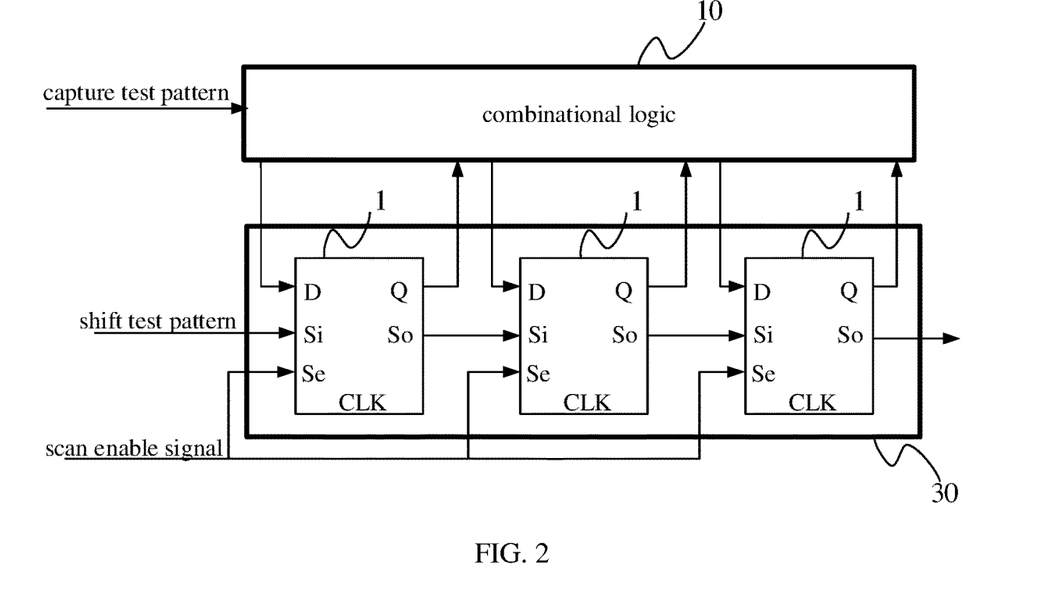
FIG. 2 is a chip structure based on a scan chain.

Optionally, FIG. 2 shows a chip structure based on a scan chain; as shown in FIG. 2, the chip may include: a combinational logic 10 and a scan chain 30. The scan chain 30 is an example of the first scan chain.

The scan chain 30 may be formed by a plurality of triggers (flip-flop) 1 each of which has a scanning ability, and the plurality of triggers are connected in order; the trigger 1 may include following ports: a D port (data input port), a Q port (data output port), an Si port (scan input port), an So port (scan out port), an Se port (scan enable port), and a CLK port (clock port).

As shown in FIG. 2, the Si port of the first trigger in the scan chain is used as the Si port of the scan chain, the So port of the last trigger in the scan chain is used as the So port of the scan chain, and the So port of a preceding trigger in the scan chain is connected to the Si port of a following trigger.

The D ports of the triggers of the scan chain are used as data input ports to be connected with the combinational logic to receive the output of the combinational logic; the Q ports of the triggers of the scan chain are used as data output ports to be connected with the combinational logic to output data to the combinational logic.

Figure 3:
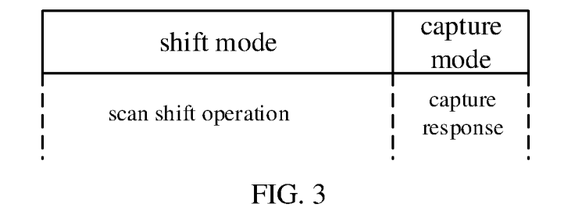
FIG. 3 is an optional schematic diagram of modes included in a scan test.

The modes of the scan test mainly include a shift mode and a capture mode; optionally, as shown in FIG. 2 and FIG. 3, in the shift mode, a shift test pattern is input into the Si port of the scan chain, and the scan chain performs a scan shift operation to configure the initial values of the triggers of the scan chain; in the capture mode, a capture test pattern is applied to the combinational logic, and the response of the combinational logic to the capture test pattern is captured by the scan chain to realize capturing response values; the switching of the shift mode and the capture mode of the chip is indicated by the scan enable signal; the scan enable signal may be considered as a representation of the test enable signal in the scan test.

It should be noted that FIG. 2 merely shows part of the signals of the chip in the scan test, and the chip in the scan test may also include other signals, such as a clock signal, etc., which are not shown in FIG. 2.

It can be seen that in the shift mode of the chip, each of the triggers is required to perform a shift operation; while in the functional mode of the chip, not all of the circuits are in a turned-on state, and only the circuits related to the function are in the turned-on state; therefore, the power consumption of the chip is much larger in the shift mode than in the functional mode. Based thereon, reducing the power consumption of the chip in the shift mode is an important scenario of reducing the testing power consumption of the chip.

The inventors of the present disclosure provide the following schemes to reduce the testing power consumption of the chip in the shift mode, before providing the solutions of reducing the testing power consumption of the chip provided by the embodiments of the present disclosure.

Figure 4:
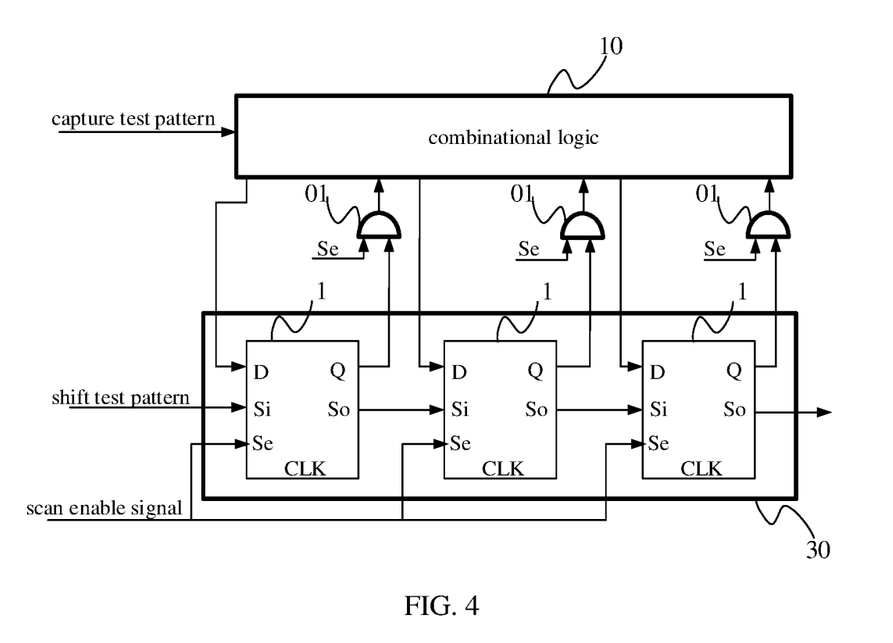
FIG. 4 is a chip structure of a first scheme provided by the inventors.

First scheme: the chip structure as shown in FIG. 4 may add a Q-gating (Q-gating) 01 at the Q port of each trigger, and the Q-gating may flip the output of the Q-gating based on the scan enable signal and the output of the Q port of the trigger; as shown in FIG. 4, the input terminal of the added Q-gating of each trigger is connected to the Q port and the Se port of the trigger, and the output terminal of the added Q-gating is connected to the combinational logic; in the case where the chip is in the shift mode (for example, the scan enable signal of the Se port connected to the input terminal of the Q-gating indicates the shift mode), the Q port of the trigger is blocked by the Q-gating from outputting signals to the combinational logic, thereby reducing the power consumption of the chip in the shift mode.

Although the first scheme can reduce the power consumption of the chip in the shift mode, the chip includes a large amount of the triggers, and the Q-gating added at the Q port of each trigger certainly greatly increases the circuit area of the chip and changes the timing sequence of the circuits. Meanwhile, the Q-gating added at the Q port of each trigger of the chip undoubtedly greatly lowers the speed performance of the chip in the functional mode, thereby resulting in the decrease in the speed performance of the chip in the functional mode.

Second scheme: compared to the first scheme of adding the Q-gating at the Q port of each trigger, the inventors provide the second scheme: selectively adding Q-gatings at the Q ports of the triggers, not adding Q-gatings for all the triggers.

The second scheme can reduce the power consumption of the chip in the shift mode to a certain extent, but the power consumption reduction effect is limited.

In view of the above, the inventors of the present disclosure provide a solution of reducing the testing power consumption of the chip in the shift mode without affecting the speed performance of the chip in the functional mode; that is, the solution provided by the embodiments of the present disclosure can reduce the testing power consumption of the chip without compromising the speed performance of the chip in the functional mode.

Figure 5:
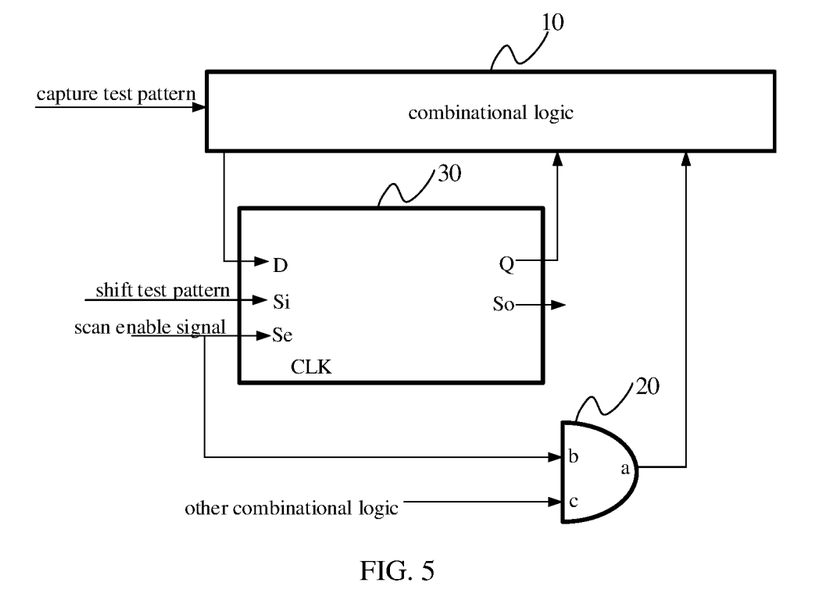
FIG. 5 is another schematic diagram of a chip structure provided by at least one embodiment of the present disclosure.

Optionally, FIG. 5 shows another schematic diagram of a chip structure provided by at least one embodiment of the present disclosure, and the chip structure may be considered as an implementation of the solution as shown in FIG. 1 in the scenario of reducing the testing power consumption of the chip in the shift mode. As shown in FIG. 5, the chip may include: a combinational logic 10, a data path gating 20, and a scan chain 30.

The scan chain 30 may be formed by a plurality of triggers 1 as shown in FIG. 2 which are connected in order, the Si port of the first trigger in the scan chain is used as the Si port of the scan chain, and the So port of the last trigger in the scan chain is used as the So port of the scan chain.

The D port of the first trigger in the scan chain may be used as the D port of the scan chain, and the Q port of the last trigger in the scan chain may be used as the Q port of the scan chain; the Se port of the scan chain is an input port of the scan enable signal, and the scan enable signal may be input to the Se ports of all the triggers in the scan chain; a CLK port of the scan chain is used to input a clock signal, and in particular, the clock signal may be input to the CLK ports of all the triggers in the scan chain.

The data path gating 20 may include at least two input terminals and an output terminal; as shown in FIG. 5, the output terminal a of the data path gating 20 may be connected to the combinational logic 10, a first input terminal b of the data path gating 20 may detect the scan enable signal (for example, the first input terminal b may detect the scan enable signal input to the Se port of the scan chain), and a second input terminal c of the data path gating 20 may be connected to other combinational logics; optionally, as an alternative embodiment, the second input terminal c may be connected to other components of the chip which are not limited to other combinational logics.

Optionally, the first input terminal of the data path gating 20 may detect a test enable signal through an enable connection line of the scan chain in the functional mode, and the enable connection line may be used to enable the scan chain in the functional mode.

For example, the connection line connecting the scan enable port of the scan chain and the first input terminal of the data path gating may be the enable connection line of the scan chain in the functional mode, i.e., the connection line connecting the first input terminal b and the scan enable signal may be implemented by the enable connection line of the scan chain in the functional mode; by using the existing enable connection line of the scan chain in the functional mode to connect the first input terminal b and the scan enable signal without adding additional connection lines, it is possible for the solution provided by the embodiments of the present disclosure to use less additional logic to achieve the reduction of the testing power consumption of the chip.

For example, the connection line connecting the scan input port of the scan chain and the first input terminal of the data path gating may be the enable connection line of the scan chain in the functional mode, i.e., the connection line connecting the first input terminal b and the scan enable signal may be implemented by the enable connection line of the scan chain in the functional mode; by using the existing enable connection line of the scan chain in the functional mode to connect the first input terminal b and the scan enable signal without adding connection lines, it is possible for the solution provided by the embodiments of the present disclosure to use less additional logic to achieve the reduction of the testing power consumption of the chip.

In another implementation, the first input terminal of the data path gating 20 may detect the test enable signal through an additionally arranged connection line; for example, the connection line connecting the first input terminal b and the scan enable signal may be a connection line additionally arranged in the chip.

It should be noted that FIG. 5 is only a simplified schematic diagram of the chip structure provided by at least one embodiment of the present disclosure, the internal structure of the scan chain 30 may refer to FIG. 2, and the chip in the scan test may also utilize other signals not shown in FIG. 5.

Based on the chip structure shown in FIG. 5, according to at least one embodiment of the present disclosure, when the chip is tested, if the first input terminal of the data path gating detects a scan shift enable signal (i.e., the scan enable signal that indicates the shift mode), the output terminal of the data path gating outputs the data path gating control signal to the combinational logic, thus disabling the data path function of the combinational logic by using the form of data path gating and through a combination of the scanning enable signal and the data path gating, so that the combinational logic disables data path toggling (data path toggle), thereby blocking this combinational logic from being controlled by other combinational logic, and reducing the testing power consumption of the chip in the shift mode. Meanwhile, compared with the solution shown in FIG. 4, the solution shown in FIG. 5 can remove the gating connected to the Q port of the trigger to ensure that the speed performance of the chip in the functional mode is not damaged. The solution provided by the embodiments of the present disclosure can reduce the testing power consumption of the chip without compromising the speed performance of the chip in the functional mode.

In at least one embodiment of the present disclosure, the shift mode is considered to be a test mode which is irrelevant to the data path function of the combinational logic. It could be understood that the chip in the shift mode performs the scan shift operation mainly by the scan chain, and thus in the shift mode, the combinational logic can disable data path toggling to reduce the testing power consumption of the chip in the shift mode. In addition, the embodiments of the present disclosure takes the scan enable signal input into the scan chain as the detection signal so that the combinational logic connected to the scan chain disables data path toggling in the case where the scan shift enable signal is detected, and the embodiments of the present disclosure realize that the additional logic for reducing testing power consumption of the chip in the shift mode is small in amount, and the testing power consumption of the chip in the shift mode may be reduced without greatly enlarging the area of the chip. Meanwhile, compared with the solution of adding a Q-gating at the Q port of each trigger, the embodiments of the present disclosure may reduce the testing power consumption of the chip without compromising the speed performance of the chip in the functional mode.

Figure 6:
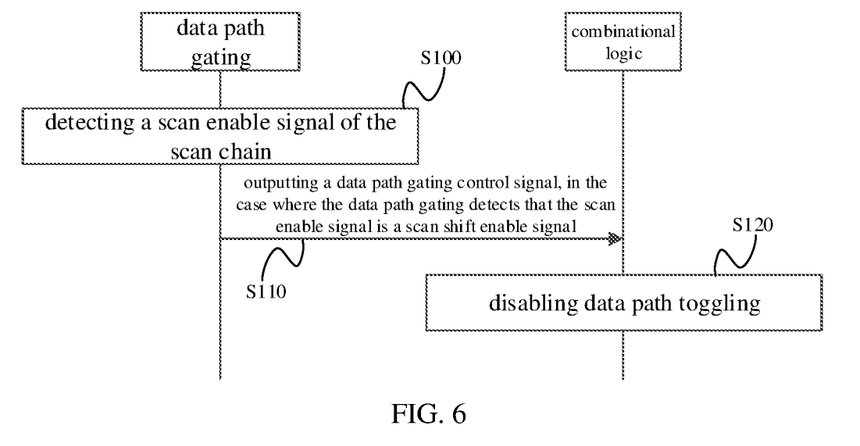
FIG. 6 is a flow chart of a testing method provided by at least one embodiment of the present disclosure.

As an optional implementation, FIG. 6 shows an optional flow of a testing method provided by at least one embodiment of the present disclosure, and the method shown in FIG. 6 may be implemented based on the structure shown in FIG. 5. With reference to FIG. 5 and FIG. 6, the method may include the following steps.

Step S100, detecting by the data path gating a scan enable signal of the scan chain.

The scan enable signal is a signal input into the scan chain for switching the shift mode and the capture mode; the data path gating may realize the detection of the scan enable signal by detecting the first input terminal of the scan enable signal.

In at least one embodiment of the present disclosure, the scan enable signal is considered to be an optional representation of the test enable signal in the shift mode.

Step S110, outputting by the data path gating a data path gating control signal, in the case where the data path gating detects that the scan enable signal is a scan shift enable signal.

Figure 7:
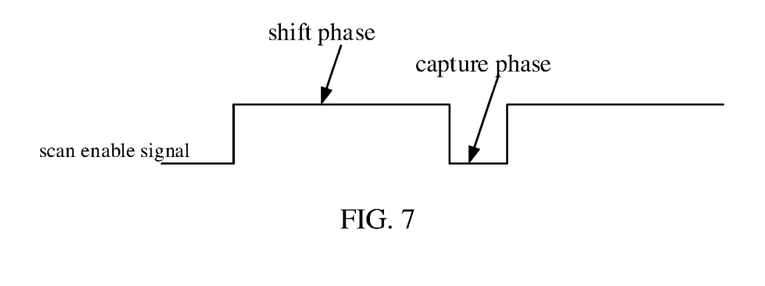
FIG. 7 is a schematic diagram of levels of a scan enable signal.

Optionally, in the case where a scan enable signal indicates switching to the shift mode, this scan enable signal can be considered as a scan shift enable signal; in an example, as shown in FIG. 7, if the scan enable signal is a high level signal, the high level signal corresponds to a shift phase, the chip is considered to be switched to the shift mode, and the scan enable signal is the scan shift enable signal; if the scan enable signal is a low level signal, the low level signal corresponds to a capture phase, and the chip is considered to be switched to the capture mode.

Optionally, more particularly, if the value of the scan enable signal is 1, it is considered that the scan enable signal is a high level signal, the chip is switched to the shift mode, and the current scan enable signal is the scan shift enable signal; if the value of the scan enable signal is 0, it is considered that the scan enable signal is a low level signal and the chip is switched to the capture mode.

In the case where the data path gating detects the scan shift enable signal, the data path gating may output a data path gating control signal to the combinational logic through the output terminal connected to the combinational logic to disable the data path function of the combinational logic so that the combinational logic disables data path toggling, thereby preventing this combinational logic from being controlled by other combinational logic.

Step S120, disabling data path toggling by the combinational logic.

Optionally, during the period when the scan enable signal is maintained as the scan shift enable signal, for example, during the period when the scan enable signal is maintained as a high level signal (for example, during the period when the value of the scan enable signal is maintained at 1), the data path gating may maintain outputting a data path gating control signal to the combinational logic so that the combinational logic maintains disabling data path toggling during the shift mode of the chip, thereby reducing the testing power consumption of the chip in the shift mode;

Optionally, if the scan enable signal indicates switching to the capture mode, for example, the scan enable signal is changed to a low level signal (for example, the value of the scan enable signal is changed to 0), the data path gating may correspondingly control the combinational logic to enable data path toggling so that the combinational logic responds to the test vector applied during the capture mode.

Optionally, in the case where the scan enable signal is the scan shift enable signal, the chip is switched to the shift mode, the shift test pattern input into the scan chain through the Si port is mainly used to realize the scan shift operation, and at least one embodiment of the present disclosure may enable the data path gating to output the data path gating control signal to the combinational logic to make the combinational logic disable data path toggling; in the case where the scan enable signal indicates switching to the capture mode, the chip is switched to the capture mode, a capture test pattern is applied to the combinational logic, the scan chain captures the response of the combinational logic, and the data path gating may control the combinational logic to enable data path toggling.

Figure 8:
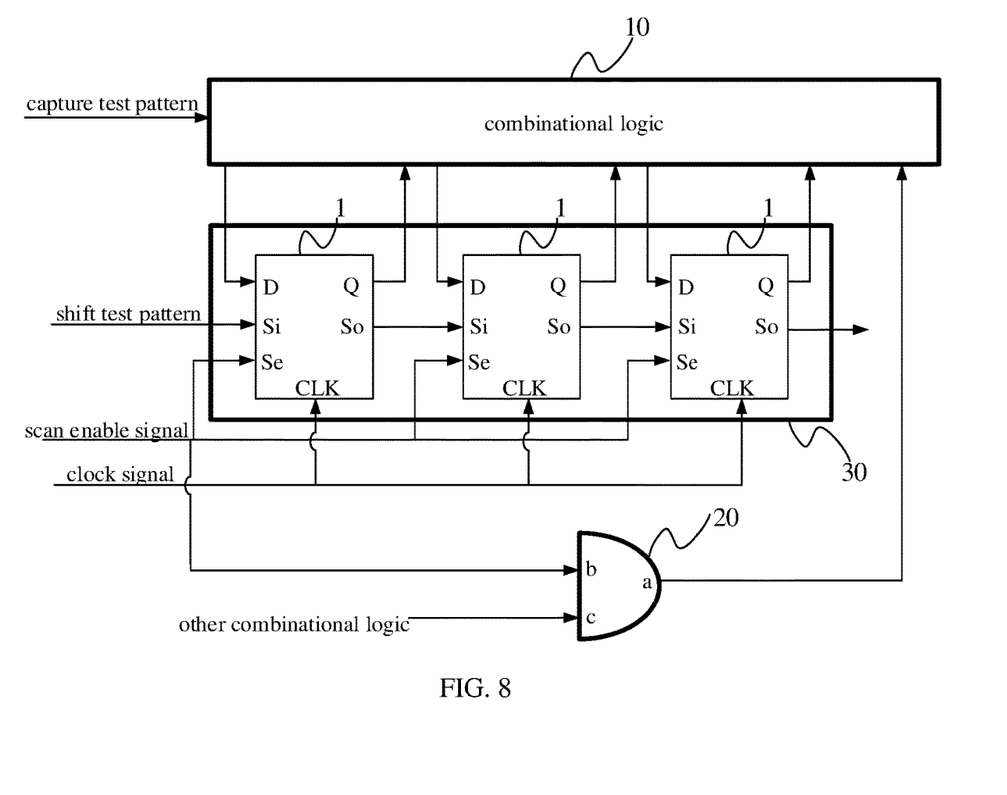
FIG. 8 is another schematic diagram of a chip structure provided by at least one embodiment of the present disclosure.

As an optional implementation, FIG. 8 is another schematic diagram of a chip structure provided by at least one embodiment of the present disclosure; with reference to FIG. 5 and FIG. 8, FIG. 8 details the structure of the scan chain 30 and details the signals related to the scan test compared with FIG. 5. The signals shown in FIG. 8 will be described below.

The scan enable signal is input to the Se port of the scan chain 30, and is used to switch the shift mode and the capture mode; optionally, the scan enable signal may be particularly input to the Se ports of all the triggers 1 of the scan chain 30; in at least one embodiment of the present disclosure, the scan enable signal may be input to the first input terminal b of the data path gating 20; optionally, the scan enable signal may be input to the first input terminal b of the data path gating 20 by use of the enable connection line of the scan chain in the functional mode.

A shift test pattern is input to the Si port of the scan chain 30 in the shift mode; optionally, the Si port of the first trigger of the scan chain 30 may receive the shift test pattern, and serially shift the shift test pattern through the So port to the Si port of a next trigger, and so on.

A capture test pattern is input the combinational logic in the capture mode.

A clock signal is a signal for clock, and particularly, may be input to the CLK ports of all the triggers of the scan chain 30.

Figure 9:
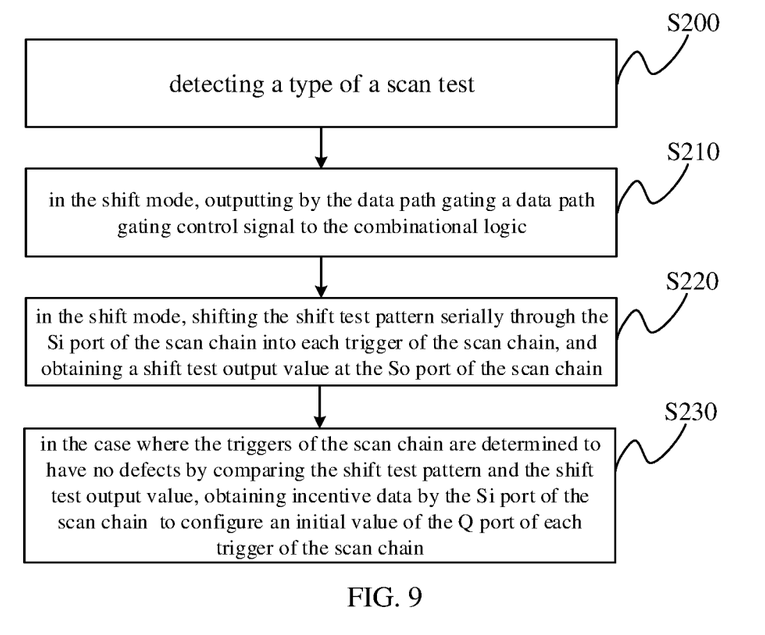
FIG. 9 is a flow chart of a chip testing method in a shift mode provided by at least one embodiment of the present disclosure.

Optionally, in the shift mode, the scan chain is mainly used to realize the scan shifting operation, and enables the data path gating to output the data path gating control signal to the combinational logic; optionally, FIG. 9 shows a flow chart of a method of testing a chip in the shift mode provided by at least one embodiment of the present disclosure, and with reference to FIG. 9, the method may include the following steps.

Step S200, detecting a type of a scan test.

Optionally, the scan test may include following types: a shift mode and a capture mode; it is possible to detect the type of the scan test by detecting the level of a scan enable signal; for example, in the case where the scan enable signal has a high level (for example, a value of the scan enable signal is 1), the shift mode is enabled, and in the case where the scan enable signal has a low level (for example, a value of the scan enable signal is 0), the capture mode is enabled.

Optionally, it is possible to realize detecting the type of the scan test by the scan chain and the data path gating.

Step S210, in the shift mode, outputting by the data path gating a data path gating control signal to the combinational logic.

After entering the shift mode, the data path gating may output the data path gating control signal to the combinational logic so that the combinational logic disables data path toggling, thereby reducing the testing power consumption in the shift mode.

Step S220, in the shift mode, shifting the shift test pattern serially through the Si port of the scan chain into each trigger of the scan chain, and obtaining a shift test output value at the So port of the scan chain.

Step S230, in the case where the triggers of the scan chain are determined to have no defects by comparing the shift test pattern and the shift test output value, obtaining incentive data by the Si port of the scan chain to configure an initial value of the Q port of each trigger of the scan chain.

Optionally, the output of the Q port of each trigger of the scan chain is used as an input to the combinational logic.

Optionally, step S220 and step S230 may be an optional implementation of the scan shift operation for the scan chain in the shift mode. Optionally, step S220 and step S230 may be carried out under the control of the clock signal in the shift mode.

Figure 10:
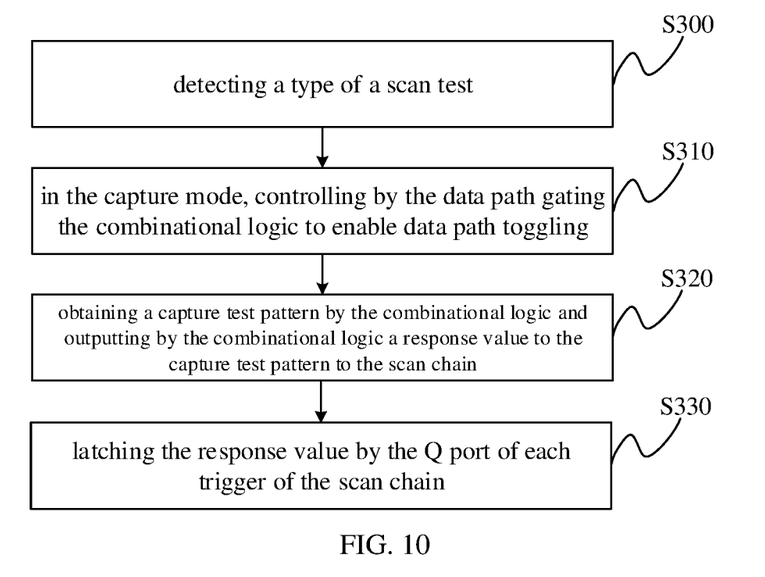
FIG. 10 is a flow chart of a chip testing method in a capture mode provided by at least one embodiment of the present disclosure.

Optionally, according to at least one embodiment of the present disclosure, in the capture mode, it is mainly realized that a capture test pattern is applied to the combinational logic so that the scan chain obtains a response of the combinational logic to the capture test pattern and the data path gating controls the combinational logic to enable data path toggling; optionally, FIG. 10 shows a flow chart of a method of testing a chip in the capture mode provided by at least one embodiment of the present disclosure, and with reference to FIG. 10, the method may include the following steps.

Step S300, detecting a type of a scan test.

Optionally, the description of step S300 may refer to the above description of step S200, and will be omitted herein.

Step S310, in the capture mode, controlling by the data path gating the combinational logic to enable data path toggling.

For example, the data path gating may transfer a controlling signal for enabling data path toggling to the combinational logic so that the combinational logic enables data path toggling.

Step S320, obtaining a capture test pattern by the combinational logic and outputting by the combinational logic a response value to the capture test pattern to the scan chain.

Step S330, latching the response value by the Q port of each trigger of the scan chain.

Figure 11:
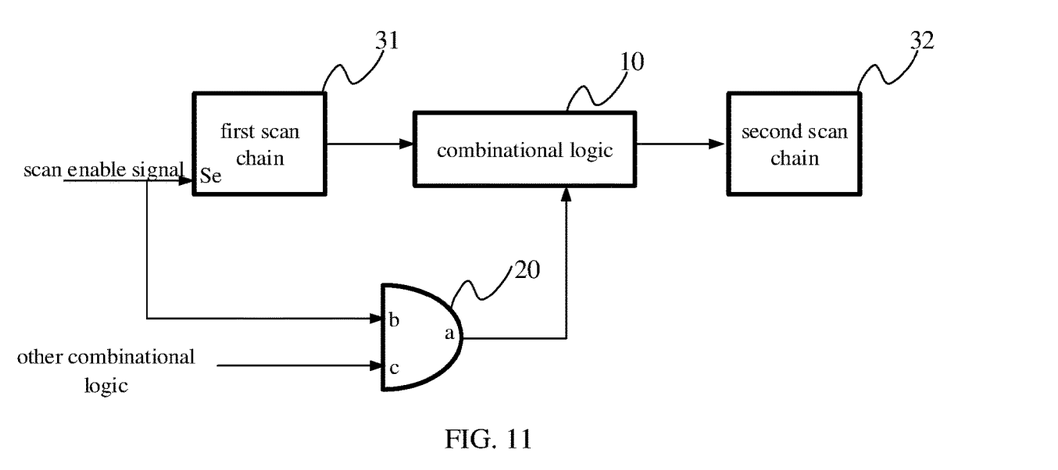
FIG. 11 is another schematic diagram of a chip structure provided by at least one embodiment of the present disclosure.

As an optional implementation of the contents disclosed in the embodiments of the present disclosure, FIG. 11 shows another schematic diagram of a chip structure provided by at least one embodiment of the present disclosure, and with reference to FIG. 11, the chip may include: a first scan chain 31, a second scan chain 32, and a combinational logic 10 connected with the first scan chain 31 and the second scan chain 32; optionally, the description of the internal structures of the first scan chain and the second scan chain may refer to the above description, and will not be omitted herein.

In at least one embodiment of the present disclosure, the connection manner of the first scan chain 31 and the combinational logic 10 may refer to the foregoing description, the combinational logic 10 may also be connected to the D port of the second scan chain 32, the second scan chain may also be connected to the next combinational logic in a manner similar to the above-mentioned connection manner of the scan chain and the combination logic, and the next combinational logic may also be connected to the next scan chain of the second scan chain, and so on.

Optionally, further, the So port of the first scan chain may be connected to the Si port of the second scan chain.

In at least one embodiment of the present disclosure, for each scan chain, the Se port of the scan chain may be connected to the input terminal of a data path gating, and the output terminal of the data path gating may be connected to the combinational logic connected to the scan chain; for example, FIG. 11 shows that the Se port of the first scan chain 31 is connected to the first input terminal b of the data path gating 20, the output terminal a of the data path gating 20 is connected to the combination logic 10, and the second input terminal c of the data path gating 20 is connected to other combination logic; similarly, for the next combinational logic connected with the second scan chain 32, the data path gating may be set in the same way.

Therefore, in the case where the data path gating 20 detects the scan enable signal indicating switching to the shift mode, the data path gating 20 may send a data path gating control signal to the combinational logic 10, so that the combinational logic disables data path toggling, thereby reducing the testing power consumption of the chip in the shift mode.

Figure 12:
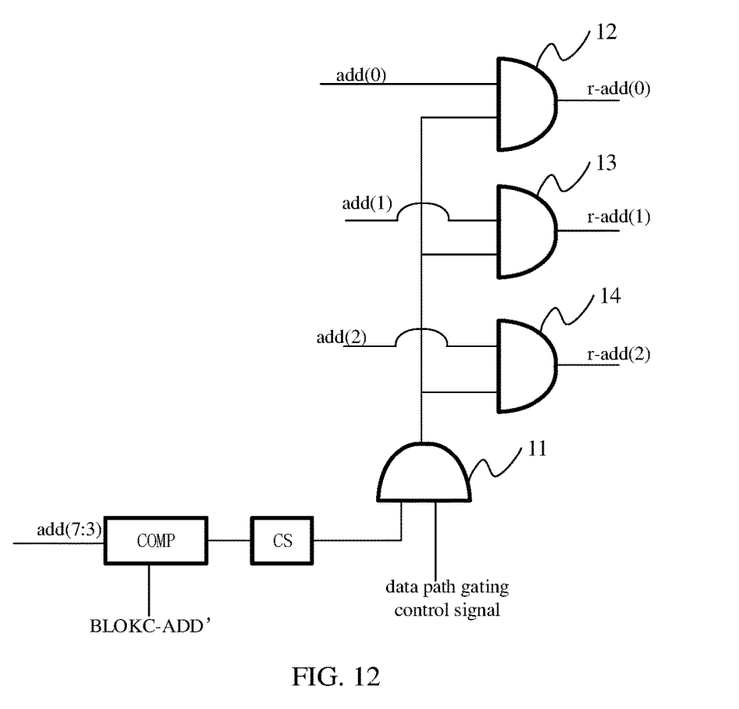
FIG. 12 is a schematic structural diagram of a combinational logic.

Optionally, as shown in FIG. 12, the simplified internal structure of the combinational logic 10 includes: an error amplifier COMP, an electric current detection input terminal CS, a first gating 11, a second gating 12, a third gating 13, and a fourth gating 14; the error amplifier COMP is connected to a block address signal (BLOKC-ADD') and receives an address signal of 7:3 (add (7:3)); the electric current detection input terminal CS is connected to the error amplifier COMP, and is connected to the input terminal of the first gating 11, another input terminal of the first gating 11 receives the data path gating control signal output by the data path gating 20, the output terminals of the first gating 11 are respectively connected to input terminals of the second gating 12, the third gating 13 and the fourth gating 14; another input terminal of the second gating 12 is connected to a 0th address signal (add (0)), and the output terminal of the second gating 12 is connected to a 0th row address signal (r-add(0)); another input terminal of the third gating 13 is connected to a 1th address signal (add(1)), and the output terminal of the third gating 13 is connected to a 1th row address signal (r-add(1)); and the fourth gating 14 is connected to a 2th address signal (add(2)), and the output terminal of the fourth gating 14 is connected to a 2th row address signal (r-add(2)).

Optionally, the first gating 11 as shown in FIG. 12 may be a built-in component of the combinational logic 10 and matches the data path gating 20 with the solution as shown in FIG. 5 being adopted and the gating connected with the Q port of the trigger in the solution as shown in FIG. 4 being removed.

Figure 13:
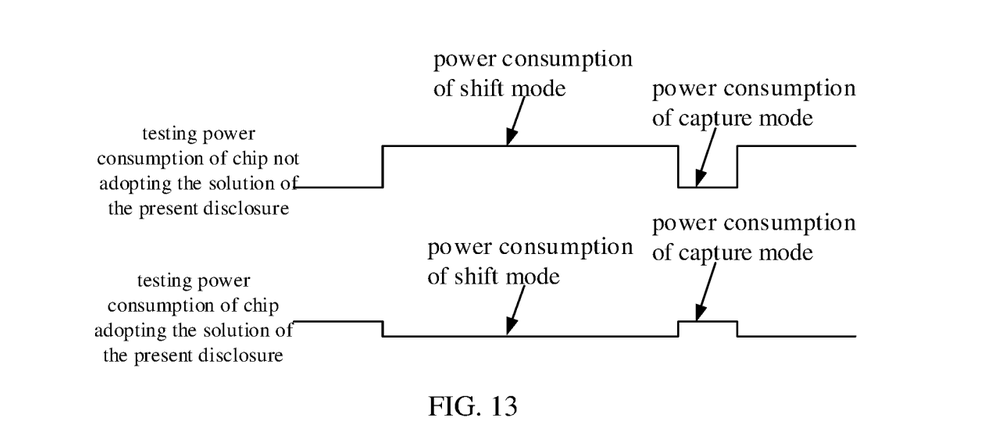
FIG. 13 is a schematic comparison diagram of testing power consumption of a chip.

In the scan test, it is possible to greatly reduce the testing power consumption of the chip by using the chip testing solution provided by the embodiments of the present disclosure. FIG. 13 shows the testing power consumption of the chip adopting the embodiments of the present disclosure and the testing power consumption of the chip not adopting the embodiments of the present disclosure. As shown in FIG. 13, the upper portion of FIG. 13 shows the testing power consumption of the chip not adopting the chip testing solution provided by the embodiments of the present disclosure, and the lower portion of FIG. 13 shows the testing power consumption of the chip adopting the chip testing solution provided by the embodiments of the present disclosure. It can be seen that it is possible to greatly reduce the testing power consumption of the chip in the shift mode by adopting the chip testing solution provided by the embodiments of the present disclosure. Meanwhile, the embodiments of the present disclosure can reduce the testing power consumption of the chip without compromising the speed performance of the chip in the functional mode.

Figure 14:
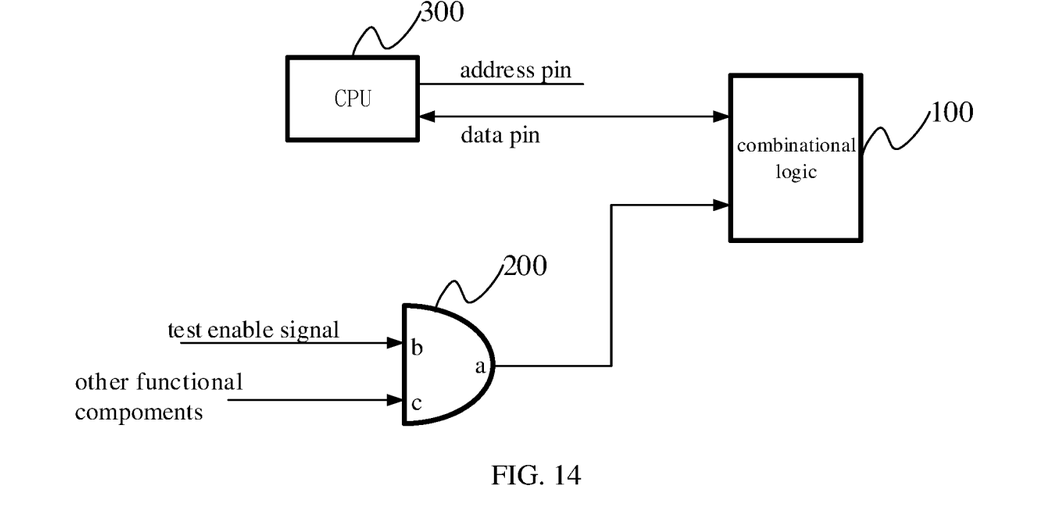
FIG. 14 is another schematic diagram of a chip structure provided by at least one embodiment of the present disclosure.

Optionally, in another application scenario of the embodiments of the present disclosure, FIG. 14 shows another schematic diagram of a chip structure provided by at least one embodiment of the present disclosure, and with reference to FIG. 14, the chip structure may include: a combinational logic 100, a data path gating 200, and a CPU (Central Processing Unit) 300.

The CPU 300 includes data pins and address pins, and the data pins of the CPU may be connected to the combinational logic 100; in the embodiments of the present disclosure, the combinational logic 100 may be a combination of the trigger (flip-flop) and an operation logic (for example, a multiplier, etc.), and the combinational logic may also be a trigger or operation logic.

The output terminal a of the data path gating 200 may be connected to the combinational logic 100, the first input terminal b of the data path gating may detect the test enable signal, and the second input terminal c of the data path gating 200 may be connected to other functional components of the chip, such as other combinational logic.

The test enable signal is used to switch the test mode of the chip, and in the case where the current test mode indicated by the test enable signal is irrelevant to the data path function of the combinational logic 100, the data path gating may output a data path gating control signal to the combinational logic 100 so that the combinational logic 100 disables data path toggling, thereby reducing the testing power consumption of the chip.

Certainly, the chip may further include other components not shown in FIG. 14, which will not be described herein.

Figure 15:
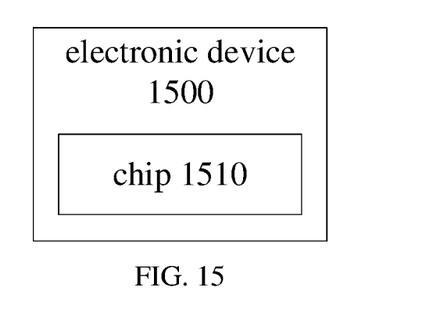
FIG. 15 is a schematic block diagram of an electronic device provided by at least one embodiment of the present disclosure.

At least one embodiment of the present disclosure may further provide an electronic device, and as shown in FIG. 15, the electronic device 1500 may include a chip 1510 which may be any of the above-mentioned chips; the electronic device may be a terminal device or a server device. For example, the electronic device may be a workstation, a cluster, a rack server, a blade server, a personal computer, a notebook computer, a tablet computer, a mobile phone, a personal digital assistance (PDA), a smart glass, a smart watch, a smart ring, a smart helmet, and the embodiments of the present disclosure have no limitation in this aspect.

According to the chip testing solution provided by at least one embodiment of the present disclosure, the chip may be provided with a data path gating, a first input terminal of the data path gating may detect a test enable signal and an output terminal of the data path gating may be connected to a combinational logic; in the case where the test enable signal which is detected by the data path gating indicates that the current test pattern is irrelevant to the data path function of the combinational logic, the output terminal of the data path gating may output a data path gating control signal to disable the data path function of the combinational logic so that the combinational logic disables data path toggling and prevents the combinational logic from being controlled by other combinational logics, and thus in the case where the current test mode is irrelevant to the data path function of the combinational logic, the combinational logic can disable data path toggling to reduce the testing power consumption of the chip without compromising the speed performance of the chip in the functional mode.

Optionally, the design of the chip structure provided by at least one embodiment of the present disclosure may be implemented based on DFT, and the chip design system may include a specification tool, a synthesis tool, a placement/routing tool, and a verification tool.

During the design process, the functionalities of the chip may be specified in a specification tool using a standard hardware programming language such as Verilog or Very High Speed Integrated Circuit Hardware Description Language (VHDL); for example, specifying the function of the additional data path gating: the data path gating may output a data path gating control signal to the combinational logic in the case where a detected test enable signal indicates that the current test pattern is irrelevant to a data path function of the combinational logic, so as to disable a data path function of the combinational logic so that the combinational logic disables data path toggling.

Further, one or more synthesis tools are used to synthesize/map the obtained circuit descriptions into the basic gates of a standard cell library; and the placement/routing tool is used to place and route the resulting gate netlist; finally, the verification tool is used to verify the connectivity and functionality of the chip; and, based on the additional data path gating, it is possible to reduce the testing power consumption of the chip in the scenario of testing the chip.

The above describes numerous example solutions provided by the embodiments of the present disclosure, and the various optional methods introduced by these example solutions can be combined and cross-referenced with each other on a non-conflicting basis, thereby obtaining a variety of possible example solutions, which are considered as example solutions disclosed in the embodiments of the present disclosure.

The foregoing merely are exemplary embodiments of the disclosure, and not intended to define the scope of the disclosure, and the scope of the disclosure is determined by the appended claims.

What is claimed is:

1. A chip, comprising: a combinational logic, a data path gating, and a first scan chain,
wherein the data path gating comprises a first input terminal, a second input terminal, and an output terminal, and the first scan chain is connected to the combinational logic,
the first input terminal of the data path gating is connected to a scan enable port of the first scan chain, so as to acquire a test enable signal input to the scan enable port, the second input terminal is connected to another combinational logic that is different from the combinational logic, and the output terminal of the data path gating is connected to the combinational logic; the test enable signal is used to switch a test mode of the chip;
the data path gating is configured to output a data path gating control signal to the combinational logic, in a case where the acquired test enable signal indicates that a current test mode is irrelevant to a data path function of the combinational logic; and
the combinational logic is configured to disable the data path function after receiving the data path gating control signal, to disable data path toggling.

2. The chip according to claim 1,
wherein
the first scan chain comprises a plurality of triggers which are connected in order; and each of the plurality of triggers at least comprises a scan input port and a scan output port; and
a scan input port of a first trigger of the first scan chain is used as a scan input port of the first scan chain, and a scan output port of a last trigger of the first scan chain is used as a scan output port of the first scan chain.

3. The chip according to claim 2, wherein in the first scan chain, a scan output port of a preceding trigger is connected to a scan input port of a following trigger.

4. The chip according to claim 2, wherein each of the plurality of triggers further comprises a data input port and a data output port,
a data input port of each of the plurality of triggers of the first scan chain is used as a data input port to be connected with the combinational logic to receive an output of the combinational logic; and
a data output port of each of the plurality of triggers of the first scan chain is used as a data output port to be connected with the combinational logic to output data to the combinational logic.

5. The chip according to claim 4, wherein each of the plurality of triggers further comprises a clock port, and
the clock port is configured to receive a clock signal.

6. The chip according to claim 2, wherein the first input terminal of the data path gating acquires the test enable signal through an enable connection line of the first scan chain which is in a functional mode.

7. The chip according to claim 6, wherein the test enable signal comprises a scan enable signal in a scan test of the chip, and the scan enable signal is configured to switch the chip from a shift mode to a capture mode or switch the chip from the capture mode to the shift mode.

8. The chip according to claim 7, wherein each of the plurality of triggers further comprises the scan enable port, wherein the scan enable port is configured to receive the scan enable signal; and
the scan enable port of each of the plurality of triggers is connected to the first input terminal of the data path gating.

9. The chip according to claim 7, wherein the data path gating is further configured to:
output a data path gating control signal to the combinational logic in a case where the acquired scan enable signal indicates the shift mode.

10. The chip according to claim 7, wherein the first scan chain is so configured that: in the shift mode, the first scan chain serially shifts a shift test pattern into each of the plurality of triggers of the first scan chain through the scan input terminal of the first scan chain and outputs a shift test output value at the scan output terminal of the first scan chain; in a case where the plurality of triggers of the first scan chain are determined to have no defects by comparing the shift test pattern and the shift test output value, the scan input port of the first scan chain obtains incentive data to configure initial values of the data output ports of the plurality of triggers of the first scan chain.

11. The chip according to claim 7, wherein
the data path gating is further configured to control the combinational logic to enable data path toggling in a case where the acquired scan enable signal indicates the capture mode;
the combinational logic is further configured to, in the capture mode, obtain a capture test pattern and to output to the first scan chain a response value corresponding to the capture test pattern; and
the first scan chain is further configured to latch the response value by the data output port of each of the plurality of triggers of the first scan chain.

12. The chip according to claim 7, wherein the scan enable signal indicates the shift mode in a case where the scan enable signal is a first level signal;
the scan enable signal indicates the capture mode in a case where the scan enable signal is a second level signal; and
a level of the first level signal is higher than a level of the second level signal.

13. The chip according to claim 12, wherein the scan enable signal is the first level signal in a case where a value of the scan enable signal is 1; and
the scan enable signal is the second level signal in a case where a value of the scan enable signal is 0.

14. The chip according to claim 2, further comprising a second scan chain,
wherein the combinational logic is connected between the first scan chain and the second scan chain;
the second scan chain comprises a plurality of triggers which are connected in order, each of the plurality of triggers of the second scan chain comprises a data input port;
the combinational logic is connected to a data input port of a first trigger of the second scan chain;
each of the plurality of triggers of the second scan chain comprises a scan input port; and
the scan output port of the first scan chain is connected to the scan input port of the first trigger of the second scan chain.

15. The chip according to claim 1, further comprising a central processing unit,
wherein the central processing unit comprises a data pin, and the data pin of the central processing unit is connected to the combinational logic.

16. A chip testing method, the chip testing method being adapted for a data path gating, a first input terminal of the data path gating being connected to a scan enable port of a first scan chain, so as to acquire a test enable signal input to the scan enable port, a second input terminal being connected to another combinational logic that is different from a combinational logic, an output terminal of the data path gating being connected to the combinational logic, the first scan chain being connected to the combinational logic, and the chip testing method comprising:

acquiring a test enable signal, wherein the test enable signal is configured to switch a test mode of the chip; and outputting a data path gating control signal to the combinational logic in a case where the acquired test enable signal indicates that a current test pattern is irrelevant to a data path function of the combinational logic, so as to disable a data path function of the combinational logic so that the combinational logic disables data path toggling.

17. The chip testing method according to claim 16, wherein the test enable signal comprises a scan enable signal in a scan test of the chip, and the scan enable signal is used to switch the chip from a shift mode to a capture mode or switch the chip from the capture mode to the shift mode;

the scan enable port of the first scan chain is configured to receive the scan enable signal;

the acquiring the test enable signal comprises:
acquiring the scan enable signal inputted to the scan enable port of the first scan chain; and the outputting the data path gating control signal to the combinational logic in the case where the acquired test enable signal indicates that the current test pattern is irrelevant to the data path function of the combinational logic comprises:
outputting the data path gating control signal to the combinational logic in a case where the acquired scan enable signal indicates the shift mode.

18. The chip testing method according to claim 17, further comprising:

controlling the combinational logic to enable data path toggling in a case where the acquired scan enable signal indicates the capture mode.

19. The chip testing method according to claim 17, wherein the scan enable signal indicates the shift mode in a case where the scan enable signal is a first level signal;

the scan enable signal indicates the capture mode in a case where the scan enable signal is a second level signal; and a level of the first level signal is higher than a level of the second level signal.

20. An electronic device, comprising a chip, wherein the chip comprises: a combinational logic, a data path gating, and a first scan chain;

the data path gating comprises a first input terminal, a second input terminal, and an output terminal, and the first scan chain is connected to the combinational logic, the first input terminal of the data path gating is connected to a scan enable port of the first scan chain, so as to acquire a test enable signal input to the scan enable port, the second input terminal is connected to another combinational logic that is different from the combinational logic, and the output terminal of the data path gating is connected to the combinational logic; the test enable signal is used to switch a test mode of the chip;

the data path gating is configured to output a data path gating control signal to the combinational logic, in a case where a current test mode indicated by the acquired test enable signal is irrelevant to a data path function of the combinational logic; and the combinational logic is configured to disable the data path function after receiving the data path gating control signal, to disable data path toggling.

* * * * *